United States Patent
Lo et al.

(10) Patent No.: US 6,329,063 B2
(45) Date of Patent: *Dec. 11, 2001

(54) METHOD FOR PRODUCING HIGH QUALITY HETEROEPITAXIAL GROWTH USING STRESS ENGINEERING AND INNOVATIVE SUBSTRATES

(75) Inventors: Yu-Hwa Lo; Felix Ejeckam, both of Ithaca, NY (US)

(73) Assignee: Nova Crystals, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/210,166

(22) Filed: Dec. 11, 1998

(51) Int. Cl.⁷ .................................................. B32B 9/06
(52) U.S. Cl. ..................... 428/450; 428/448; 428/469; 428/641; 428/642
(58) Field of Search ................... 428/446, 450, 428/469, 641, 642, 448

(56) References Cited

U.S. PATENT DOCUMENTS

| | | | |
|---|---|---|---|
| 4,551,394 | * 11/1985 | Betsch et al. | 428/641 |
| 4,830,984 | 5/1989 | Purdes | 437/126 |
| 4,963,949 | 10/1990 | Wanlass et al. | 357/16 |
| 5,011,550 | 4/1991 | Konushi et al. | 148/33.5 |
| 5,091,133 | 2/1992 | Kobayashi et al. | 264/119 |
| 5,145,793 | 9/1992 | Oohara et al. | 437/5 |
| 5,294,808 | 3/1994 | Lo | 257/17 |
| 5,403,673 | * 4/1995 | Haga et al. | 428/701 |
| 5,444,016 | * 8/1995 | Abrokwah et al. | 437/184 |
| 5,484,664 | * 1/1996 | Kitahara et al. | 428/641 |
| 5,659,187 | 8/1997 | Legoyes et al. | 257/190 |
| 5,759,898 | 6/1998 | Ek et al. | 438/291 |
| 5,993,981 | * 11/1999 | Askinazi et al. | 428/432 |

FOREIGN PATENT DOCUMENTS

| | | | |
|---|---|---|---|
| 0291346 | 5/1988 | (EP) | H01L/21/20 |
| 0455360A1 | 4/1991 | (EP) | H01L/31/068 |
| 0455526A1 | 4/1991 | (EP) | H01L/21/20 |

OTHER PUBLICATIONS

Ejeckam, F.E., et al., Lattice engineered complaint substrate for defect–free heteroepitaxial growth, Mar. 31, 1997, Appl. Phys. Lett. 70 (13) pp. 1685–1687.

Uchida, H. et al., Reduction of dislocation density by thermal annealing for Ga/As/GaSb/Si heterostructure, May 1995, Journal of Crystal Growth, 1500 pp. 681–684.

* cited by examiner

Primary Examiner—Cathy Lam
(74) Attorney, Agent, or Firm—Fernandez & Associates LLP

(57) ABSTRACT

A method for producing a stress-engineered substrate includes selecting first and second materials for forming the substrate. An epitaxial material for forming a heteroepitaxial layer is then selected. If the lattice constant of the heteroepitaxial layer ($a_{epi}$) is greater than that ($a_{sub}$) of the immediate substrate layer the epitaxial layer is deposited on, then the epitaxial layer is kept under "compressive stress" (negative stress) at all temperatures of concern. On the other hand, if the lattice constant of the heteroepitaxial layer ($a_{epi}$) is less than that ($a_{sub}$) of the immediate substrate layer the epitaxial layer is deposited on, then the epitaxial layer is kept under "tensile stress" (positive stress). The temperatures of concern range from the annealing temperature to the lowest temperature where dislocations are still mobile.

5 Claims, 4 Drawing Sheets

Tg: epitaxial growth temperature
Ta: annealing temperature
Ti: lowest temperature where dislocations are mobile $\Delta\alpha = \alpha_{epi} - \alpha_{sub}$ Assumes $a_{epi} > a_{sub}$ a is lattice constant $\alpha$ is thermal expansion coefficient ID# METHOD FOR PRODUCING HIGH QUALITY HETEROEPITAXIAL GROWTH USING STRESS ENGINEERING AND INNOVATIVE SUBSTRATES

FIELD OF THE INVENTION

The invention pertains to the field of heteroepitaxial growth of single crystal thin layers on substrates of different lattice constants. More particularly, the invention pertains to forming stress-engineered substrates as platforms for the growth of high quality heteroepitaxial layers.

BACKGROUND OF THE INVENTION

Heteroepitaxy refers to growth of single crystal thin layers on substrates of different lattice constants (or atomic spacing). If achievable, high quality semiconductor heteroepitaxial layers have many important applications in electronics and optoelectronics. Their benefits include enhanced speed and power efficiency for RF amplifiers in wireless communication, and enhanced quantum efficiency and operating wavelength range for optoelectronic devices such as lasers, LEDs, and detectors. However, in reality, with exceptions of very few cases, the great potential benefits of heteroepitaxial films can not be realized because the heteroepitaxial layers achievable today contain a large number of defects, specifically threading dislocations. These dislocations in the heteroepitaxial layers degrade device performance and reliability so much that heteroepitaxy is rarely used for any commercial applications. Therefore, to realize the great potential of heteroepitaxy, it is imperative to find ways to significantly reduce the number of threading dislocations in the heteroepitaxial layers.

U.S. Pat. No. 5,294,808 (Lo) requires ultra thin substrates or a sacrificial substrate for dislocation gettering. U.S. Pat. No. 5,091,133 (Fan et al.) uses thermal stress from thermal annealing/cycling by interrupting the growth. The stress produced in the method of the '133 patent only exists during thermal annealing. U.S. Pat. No. 5,659,187 (Legoues et al.) discloses a method wherein the dislocation bending force is only over the strain graded buffer layers. Furthermore, new dislocations may be nucleated in the strain graded buffer layers as they bend the existing dislocations.

Referring to FIG. 1, when a heteroepitaxial thin film 5 is grown on a substrate 8, its lattice is initially deformed elastically to match that of the substrate. Hence the stress in the heteroepitaxial material builds up as the film 5 grows thicker. At a certain film thickness, namely the critical thickness, the strain energy is too high to be accommodated by elastic deformation and the thin film becomes plastically deformed by forming dislocations. According to the well established theory, dislocations are most likely nucleated at the surface 7 of the heteroepitaxial layer and then propagate towards the film-substrate interface 6 to become misfit dislocations for strain release. The strain releasing misfit dislocations may be extended over a finite distance until they either reach the edge of the wafer or most likely thread up to the surface 7 of the heteroepitaxial layer.

The formation of the above described "dislocation half loop", shown at 30, consists of a section of misfit dislocation 10 and two threading dislocations 20, 21. The misfit dislocation 10 portion of the dislocation half loop 30 relaxes the strain and does no harm to devices built in the heteroepitaxial layers since it is confined at the interface. However, the threading dislocation portions 20, 21 of the half loop 30 run across the entire thickness of the film, thus being detrimental to devices. Therefore, the key to improving the quality of heteroepitaxial film is to minimize the density of threading dislocations while keeping the misfit dislocations for strain release.

SUMMARY OF THE INVENTION

Briefly stated, a method for producing a stress-engineered substrate includes selecting first and second materials for forming the substrate. An epitaxial material for forming a heteroepitaxial layer is then selected. If the lattice constant of the heteroepitaxial layer ($a_{epi}$) is greater than that ($a_{sub}$) of the immediate substrate layer the epitaxial layer is deposited on, then the epitaxial layer is kept under "compressive stress" (negative stress) at all temperatures of concern. On the other hand, if the lattice constant of the heteroepitaxial layer ($a_{epi}$) is less than that ($a_{sub}$) of the immediate substrate layer the epitaxial layer is deposited on, then the epitaxial layer is kept under "tensile stress" (positive stress). The temperatures of concern range from the annealing temperature to the lowest temperature where dislocations are still mobile.

According to an embodiment of the invention, a method for producing a stress-engineered substrate includes steps of:

a) selecting first and second materials for forming the substrate, the first material having a first lattice constant;

b) selecting an epitaxial material for forming a heteroepitaxial layer, the epitaxial material having a second lattice constant;

c) comparing the second lattice constant to the first lattice constant to determine which lattice constant is greater;

d) keeping, when the second lattice constant is greater than the first lattice constant, the heteroepitaxial layer under compressive stress for a range of temperatures, the range of temperatures being from an annealing temperature of the substrate to a lowest temperature where dislocations are still mobile in the heteroepitaxial layer and e) keeping, when the second lattice constant is less than the first lattice constant, the heteroepitaxial layer under tensile stress for a range of temperatures, the range of temperatures being from an annealing temperature of the substrate to a lowest temperature where dislocations are still mobile in the heteroepitaxial layer.

According to an embodiment of the invention, a stress-engineered substrate for receiving a heteroepitaxial layer thereon includes a first stress control layer having a first lattice constant; a second stress control layer; a joining layer between the first stress control layer and the second stress control layer; a heteroepitaxial layer having a second constant on the first control layer; and means for choosing the first and second lattice constants, such that when the second lattice constant is greater than the first lattice constant, the heteroepitaxial layer is under compressive stress for a range of temperatures, the range of temperatures being from an annealing temperature of the substrate to a lowest temperature where dislocations are still mobile in the heteroepitaxial layer, and when the second lattice constant is less than the first lattice constant, the heteroepitaxial layer is under tensile stress for the range of temperatures.

According to an embodiment of the invention, a stress-engineered substrate for receiving a heteroepitaxial layer thereon includes a first stress control layer; a second stress control layer; a joining layer between the first stress control layer and the second stress control layer; a template layer on the first stress control layer, the template layer having a first lattice constant; a heteroepitaxial layer having a second lattice constant on the template layer; and means for choosing the first and second lattice constants, such that when the second lattice constant is greater than the first lattice constant, the heteroepitaxial layer is under compressive stress for a range of temperatures, the range of temperatures being from an annealing temperature of the substrate to a lowest temperature where dislocations are still mobile in the heteroepitaxial layer, and when the second lattice constant is less than the first lattice constant, the heteroepitaxial layer is under tensile stress for the range of temperatures.

DESCRIPTION OF THE PREFERRED EMBODIMENT

Figure 1:
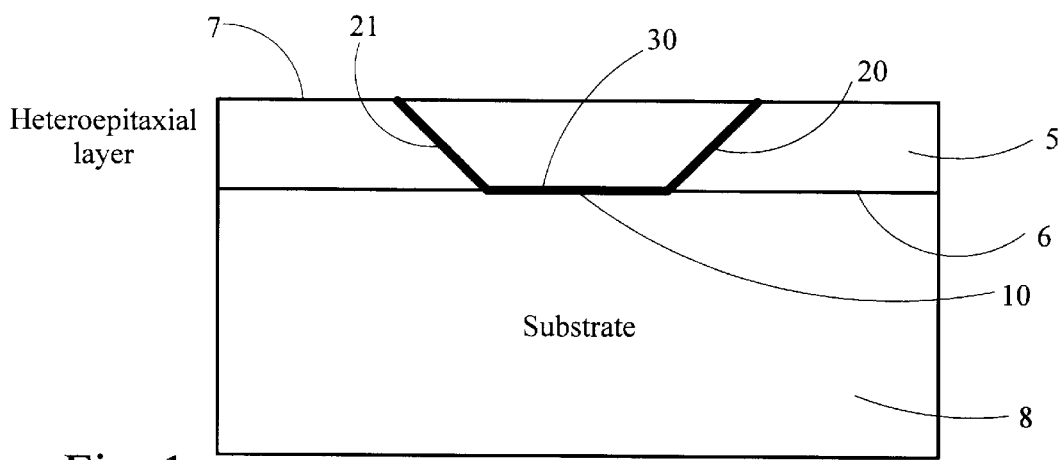
FIG. 1 shows a dislocation half loop as occurs in the prior art.

The above theory of defects in heteroepitaxy may be over simplified without taking into account of the effects of dislocation multiplication, pinning, and interaction. However, it is widely accepted that the model of dislocation half loops is at the core of these mechanisms. Another implicit assumption behind the dislocation half loop model is that the growth is two dimensional from the very beginning rather than being 3D island growth. Two-dimensional growth means that the heteroepitaxial layer is deposited layer by layer. This is normally a good assumption for most heteroepitaxial growth with a small (e.g., <2%) lattice mismatch. Lattice mismatch refers to a difference in lattice constants. If the mismatch is high, 3D island growth usually occurs to minimize the strain energy until the 3D islands coalesce. Unlike dislocation half loops, the position and spacing of threading dislocations for 3D island growth is controlled by the coalescence of the islands. However, by growing buffer layers with their lattice constants graded continuously or in steps, one can always maintain the 2D growth mode. This is because between any two subsequent layers of material, their lattice constant only differs slightly.

For example, to grow an InAs epitaxial layer on a GaAs substrate with a 7% lattice mismatch, one can always grow a series of InGaAs buffer layers of increasing In composition. If the In composition between any pair of InGaAs layers differs by only 20%, the lattice mismatch between two layers can be controlled to be within 1.5%, a condition in favor of 2D growth. Therefore, developing a method to reduce the threading dislocation density in 2D grown heteroepitaxial layers permits us to apply a similar technique to heteroepitaxial layers of large lattice mismatch. In some special cases, such as ZnSe layers grown on GaAs, due to the large surface energy difference between the two materials, the growth tends to be three-dimensional from the very beginning although the lattice mismatch is small. Even in such situations where the dislocation half loop model does not apply, the method of the present invention still works. This is because the method confines dislocations via interactions between the dislocations and the stress field applied to the epitaxial layers by the substrate. Therefore, as long as all dislocations contain a common Burgers vector component in favor of such interactions, the dislocation confining mechanisms work. Fortunately, the above condition is satisfied by all heteroepitaxial material systems, so our approach of stress-engineered substrates should be truly generic. We use the model of dislocation half loop only for illustration purpose, although this model applies to the majority of heteroepitaxial material systems of interest.

In our invention, we use a new substrate structure for epitaxial growth so that the dislocations in the heteroepitaxial layer experience a stress field of controlled direction and magnitude. Through interactions between the dislocations and the specific stress field, dislocation half loops are extended. As a result, the following three threading dislocation reduction and confining mechanisms may take place.

Figure 2:
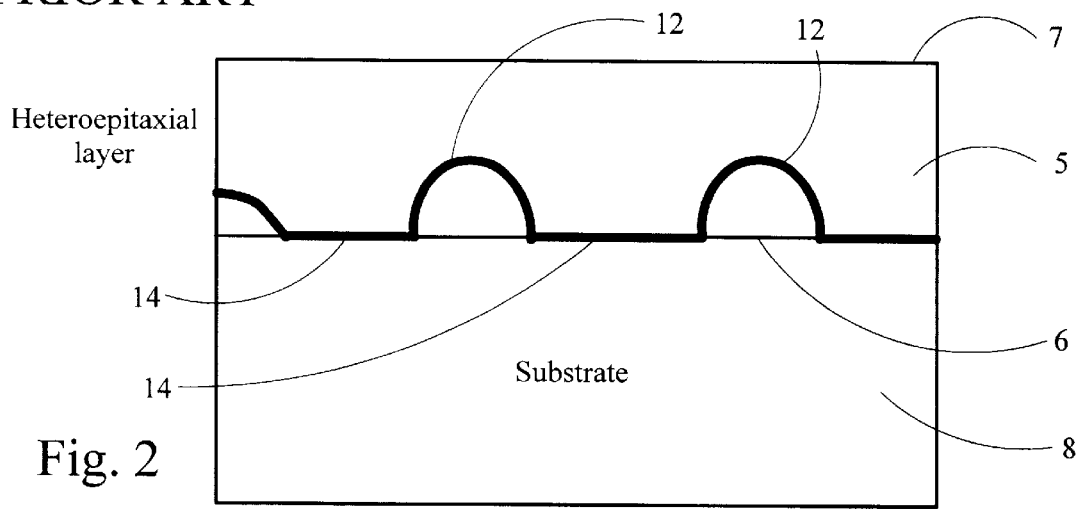
FIG. 2 shows embedded closed dislocation loops through interactions among threading dislocations and the stress field.

First, expansion of the dislocation half loops means an increase in the average distance between threading dislocations or equivalently, a decrease in threading dislocation density. Second, when the expanding dislocation half loops approach to and interact with each other, the threading dislocations may terminate themselves by forming a closed dislocation loop 12 as shown in FIG. 2. Misfit dislocations 14 remain between dislocation loops 12. This process is more likely to happen under the right stress field than without because the interaction of dislocations reduces the system energy more with the presence of the right stress field.

Figure 3:
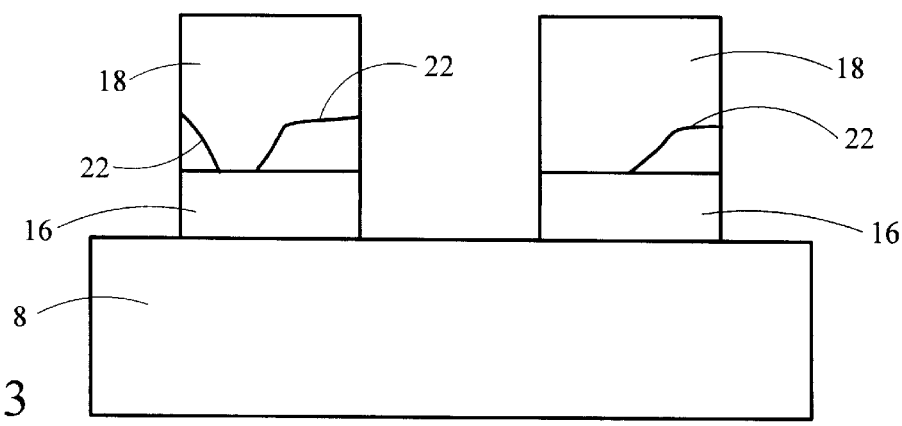
FIG. 3 shows heteroepitaxial growth layers grown on substrate mesas.

Referring to FIG. 3, the stress field may bend threading dislocations towards the side of the wafer to reduce the system energy, preventing them from propagating upward. Growing heteroepitaxial layers 18 on predefined substrate mesas 16 makes this mechanism particularly effective if the heteroepitaxial layer is grown on predefined substrate mesas. Bent dislocations 22 propagate towards the sides of layers 18 instead of upwards.

Figure 4:
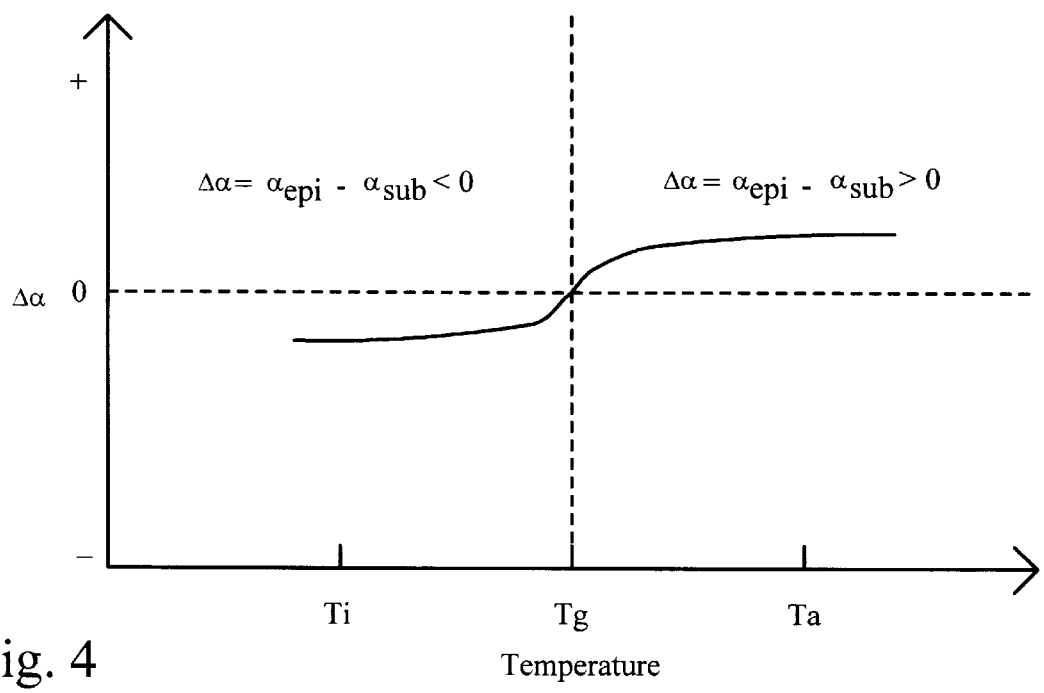
FIG. 4 shows a graph of the thermal expansion coefficient difference between the heteroepitaxial layer and the stress-engineered substrate at different temperatures of concern.

Referring to FIG. 4, the key concept is to design a new substrate that creates the desired stress field in the heteroepitaxial layer over the temperature range of interest, specifically from the annealing temperature to the lowest temperature where dislocations are still mobile. There exists a very simple rule to find out the right "sign" of the stress field. If the lattice constant of the heteroepitaxial layer ($a_{epi}$) is greater than that ($a_{sub}$) of the immediate substrate layer the epitaxial layer is deposited on, then we want to keep the epitaxial layer under "compressive stress" (negative stress) at all temperatures. On the other hand, if the lattice constant of the heteroepitaxial layer ($a_{epi}$) is less than that ($a_{sub}$) of the immediate substrate layer the epitaxial layer is deposited on, then we want to keep the epitaxial layer under "tensile stress" (positive stress).

One possible source of the stress field is thermal stress due to different thermal expansion coefficients ($\alpha$) of the epitaxial and substrate materials. At the epitaxial growth temperature, the epitaxial layer experiences no thermal stress. Thermal stress develops when the temperature of the material is different from the original growth temperature. The thermal stress is proportional to $\Delta T$ and $\Delta \alpha$, where $\Delta T$ is the temperature difference between the current growth temperature and the original growth temperature and $\Delta \alpha$, is the thermal expansion coefficient difference between the epitaxial layer and the substrate. When the substrate is made of more than one type of material, the thermal expansion coefficient for the substrate is approximately the average of the thermal expansion coefficients for all the substrate materials, weighted by the thickness and mechanical properties (e.g. Young's modulus and Poission ratio) of each substrate material.

If thermal stress is used to constrain threading dislocations, an ideal strain-engineered substrate should possess the following property in case the epilayer has a "larger" lattice constant than the substrate. At the high annealing temperature, the epilayer should have a larger expansion coefficient than the substrate so that the epitaxial layer can be under compressive stress. When the sample is finally cooled down to lower than the growth temperature, the expansion coefficient of the epilayer should be equal to (no stress) or less than (compressive stress) that of the substrate. We want to use the stress field to bend or confine the threading dislocations during the high temperature annealing where dislocations are most mobile; and we want these bent dislocations to remain stable during cooling. Such an ideal scenario can not be achieved using any conventional substrates.

Let us use GaAs layers on Si substrates as an example. During high temperature annealing (e.g. 900° C.), the GaAs layer is under compression so threading dislocations can be properly confined near the GaAs/Si interface. However, when the sample is cooled from the growth temperature (e.g. 600 to 700° C.) to lower than 500° C., the GaAs layer is under tensile stress due to its larger thermal expansion coefficient than Si. The tension stress not only unleashes the confined threading dislocations but also generates new threading dislocations if it is greater than the yield stress of GaAs. As a result, the quality of the GaAs layer becomes poor again. The same argument applies to cases where heteroepitaxial layers have a smaller lattice constant than the substrate. In that situation, the epitaxial layer should be under tension (positive stress) over the entire temperature range, above and below the growth temperature; and the stress-engineered substrates should be designed accordingly to satisfy this requirement.

Since the thermal expansion coefficient of a material varies with temperature, our proposed strain-engineered substrate should have its relative thermal expansion coefficient as shown in FIG. 4 in order to always generate the right stress field in the epilayer. However, it is difficult, if not impossible, to find a single substrate material to achieve the desired thermal expansion coefficient, so the stress-engineered substrate usually has to be made of multiple layers of materials.

Figure 5:
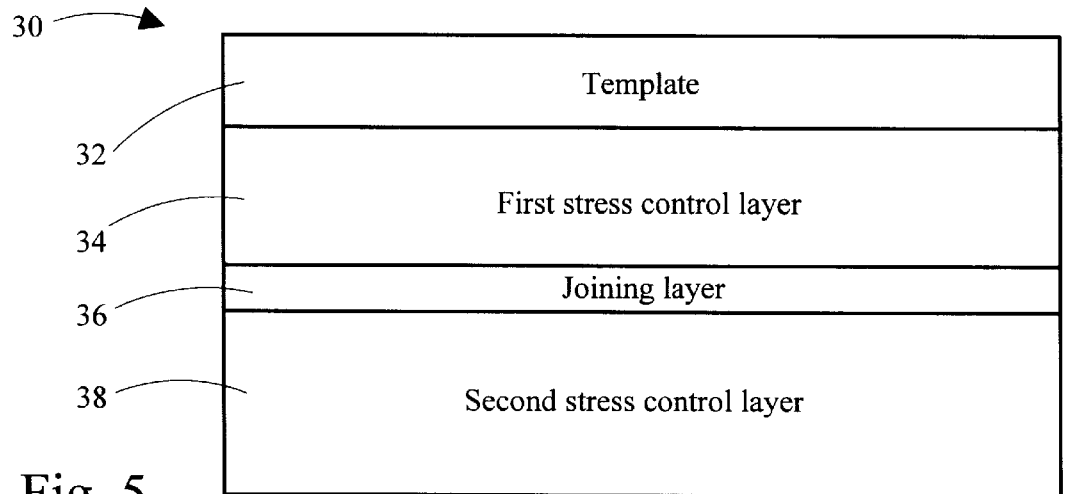
FIG. 5 shows a generic stress-engineered substrate produced according to the method of the present invention.

Referring to FIG. 5, a generic stress-engineered substrate 30 is shown. The top layer is a thin template 32 that establishes the lattice constant of the substrate 30. The template 32 is joined or bonded to a first stress control layer 34 that predominantly determines the stress field in the heteroepitaxial layer above the growth temperature. A thin joining layer 36 joins the first stress control layer 34 and a second stress control layer 38. The thin joining layer 36 may change its mechanical properties drastically at different temperatures. At high temperatures, the material of joining layer 36 is softened enough so second stress control layer 38 will not have much effect on the stress field in the epilayer. Below the epitaxial growth temperature, however, the thin joining layer 36 is hardened so the stress field in the epilayer will be determined by the thermal expansion coefficients of both the first and second stress control layers 34, 38.

It is noteworthy that the template 32 does not have to be a different material than the first stress control layer 34. They may be the same material but of different crystal orientations, or may be completely identical. Only template 32 needs to be a single crystal, whereas the rest of the substrate layers can be polycrystalline or amorphous. The thin joining material may be metal or metal alloy with an appropriate melting temperature or may be glass of temperature dependent viscosity. The joining material may be even the same as the second stress control layer 38 if this material also happens to have the right thermal expansion coefficient and mechanical properties.

We discuss a few stress-engineered substrates for some popular applications. Many other stress-engineered substrates can be designed and fabricated using similar methods.

Figure 6:
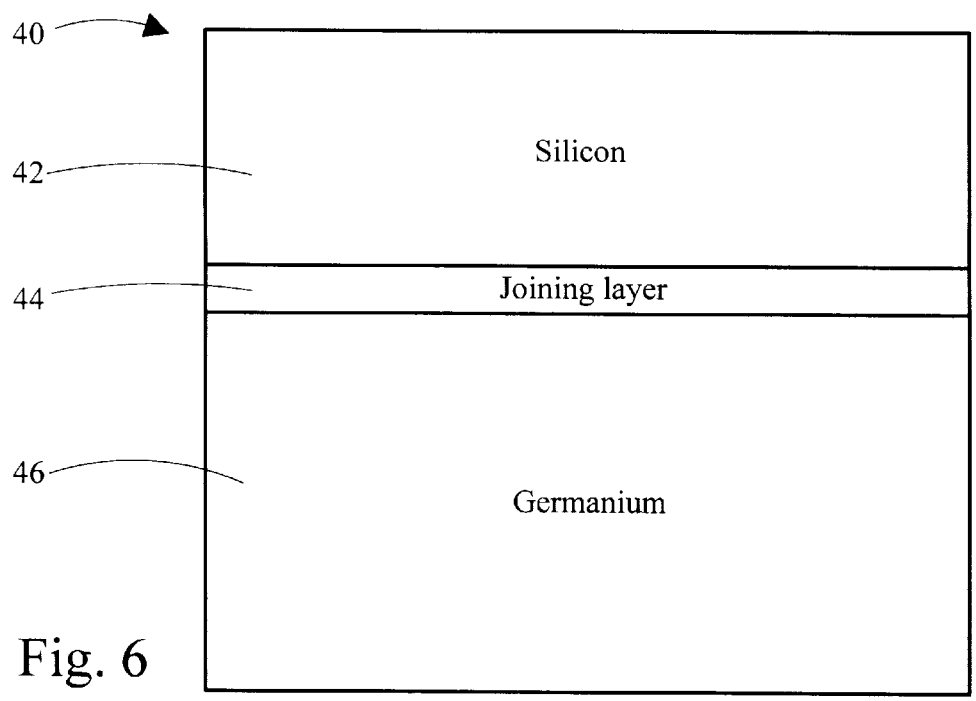
FIG. 6 shows a stress-engineered substrate suitable for GaAs on Si and InP on Si heteroepitaxial growth.
Figure 8:
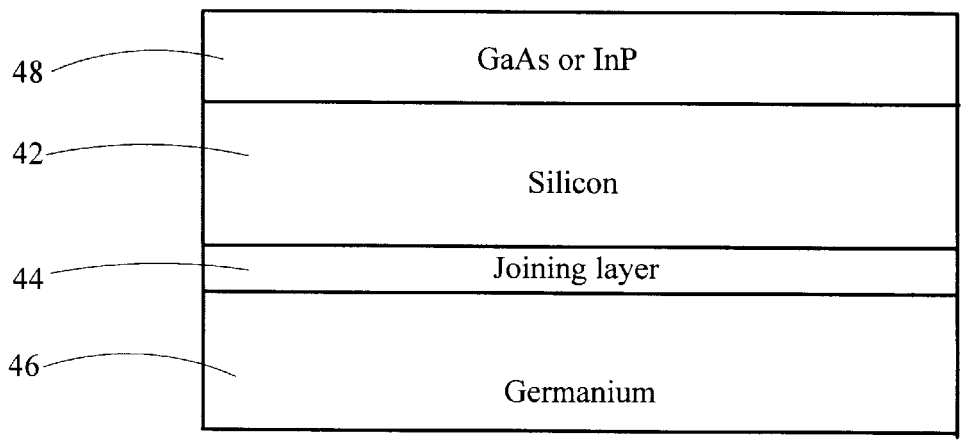
FIG. 8 shows the stress-engineered substrate of FIG. 6 with a GaAs or InP epilayer on the Si layer.

(1) GaAs-on-Si and InP-on-Si heteroepitaxial growth:

Referring to FIGS. 6 and 8, depositing GaAs-based or InP-based compound semiconductors on Si is attractive for high-efficiency solar cells for space applications and for optical interconnects between microelectronic circuits. This material structure also finds applications in areas such as infrared sensors and wireless communications where the heterojunction bipolar transistor power amplifier circuits can be fabricated on low-cost substrates. However, direct growth of GaAs or InP on Si yields poor results because their lattice constants are 4% and 7.7% larger than Si, respectively. A substrate 40 comprises a top Si substrate 42 and a bottom Ge substrate 46 with a thin, low melting point joining layer 44 (e.g. Al) in between. When a GaAs or InP epilayer 48 (FIG. 8) is grown on Si substrate 42 and annealed at a temperature higher than the growth temperature, the thin joining layer 44 is softened enough to decouple the bottom Ge substrate 46 from the top Si substrate 42. Because Si has a smaller thermal expansion coefficient than GaAs and InP, the GaAs or InP epilayer 48 is under compression during annealing so threading dislocations in epilayer 48 are confined. When the temperature falls below the growth temperature, the joining layer 44 is hardened so the thermal expansion coefficient of the substrate 40 is the weighted average of Si and Ge. For InP-on-Si growth, the thermal expansion coefficient of InP is between the coefficient values of Si and Ge, so it is easy to choose the thickness of Si and Ge material to achieve thermal matching with InP during cooling. For GaAs-on-Si growth, the thermal coefficient of GaAs is nearly the same as that of Ge but significantly greater than Si, so it is impossible to achieve perfect thermal match during cooling. However, using a large Ge/Si thickness ratio, the thermal mismatch during cooling can be significantly reduced to below the yield stress of GaAs. Therefore, high quality GaAs heteroepitaxial layers can also be achieved.

Figure 7:
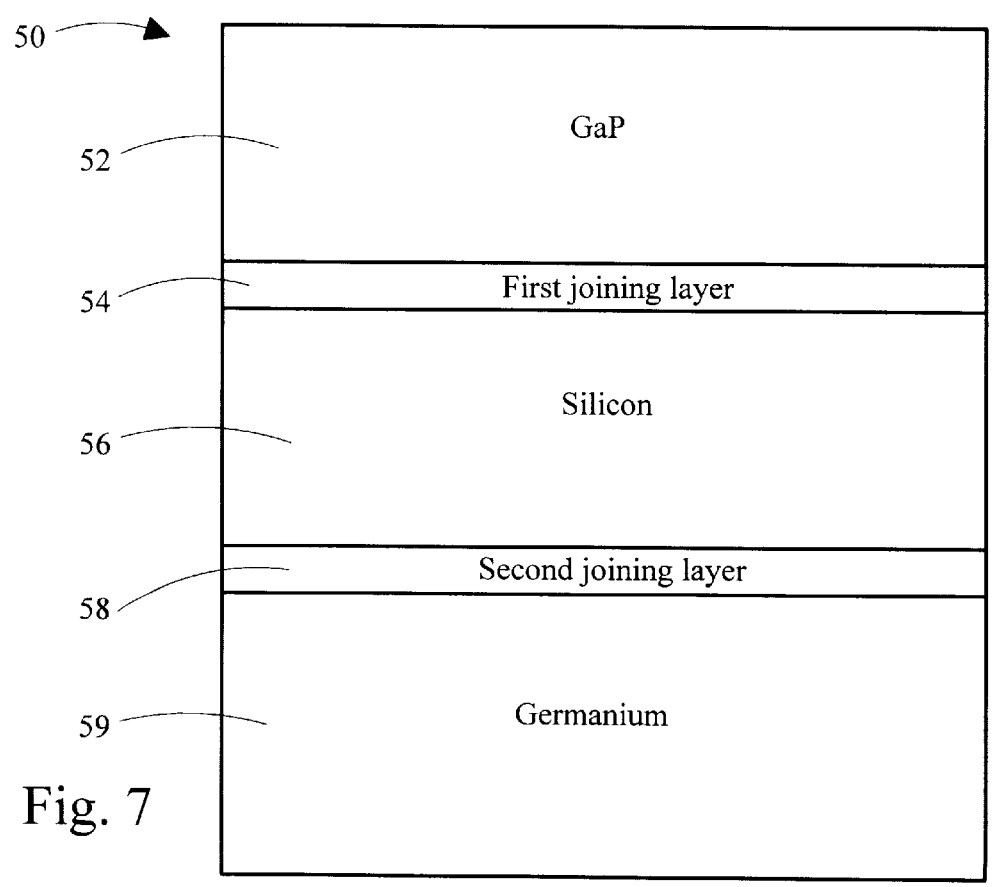
FIG. 7 shows a stress-engineered substrate suitable for AlInGaP on GaP heteroepitaxial growth.
Figure 9:
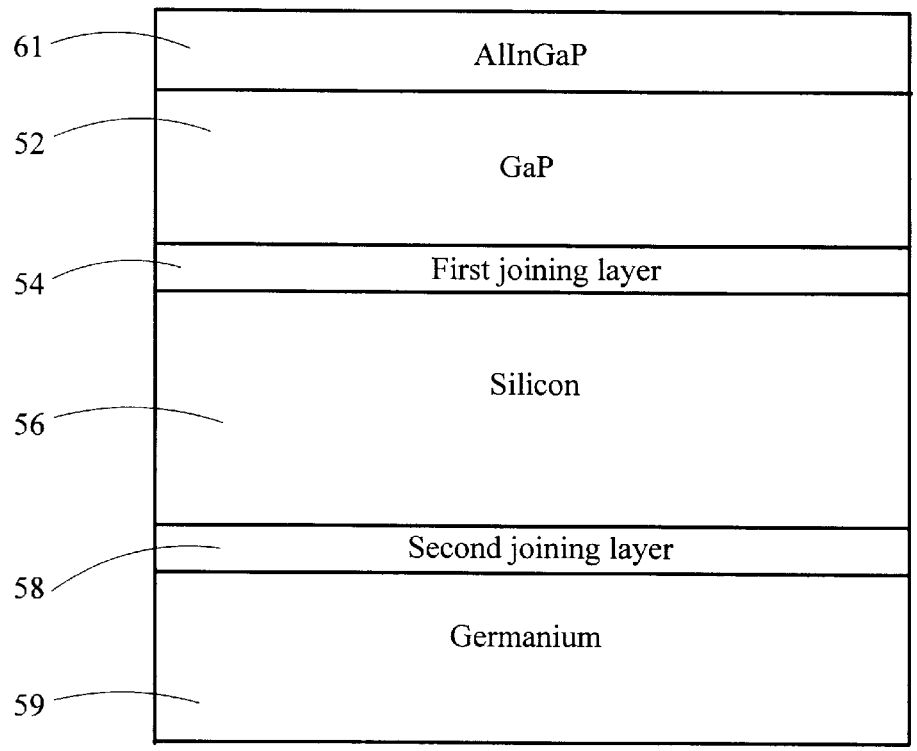
FIG. 9 shows the stress-engineered substrate of FIG. 7 with an AlInGaP layer on the GaP layer.
Figure 10:
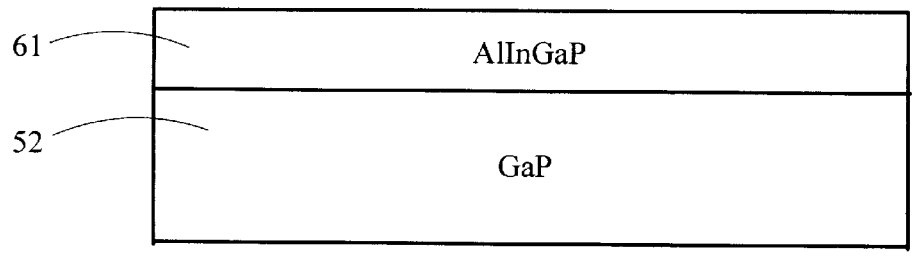
FIG. 10 shows the results of the AlInGaP on GaP heteroepitaxial growth with the Si and Ge substrates removed.

(2) AlInGaP-on-GaP heteroepitaxial growth:

Referring to FIGS. 7 and 9, AlInGaP epitaxial layers are the light emitting layers for high brightness red, orange, and yellow LEDs, a class of devices that have found many important applications. To date, epitaxial AlInGaP layers can only be grown lattice-matched to conventional GaAs substrates. Unfortunately, GaAs substrates are opaque to visible light, so a large portion of the emitted light is absorbed by the GaAs substrates, which significantly reduces the device efficiency. Visible LEDs of four times higher efficiency can be achieved if the AlInGaP layers can instead be grown on transparent GaP substrates. In practice, the 4% larger lattice constant of AlInGaP than GaP makes the heteroepitaxial AlInGaP layers too poor to be useful. To use the stress-engineered substrate technique of the present invention to solve the problem, we form a substrate 50 comprising a top GaP substrate 52 for epi growth, a first thin joining layer 54, a bonded Si layer 56, a second thin joining layer 58, and a bottom Ge substrate 59. The first joining layer 54 (e.g. $SiO_2$) is hard over the entire temperature range, while the second joining layer 58 (e.g., Al or Al alloys) will be softened at the annealing temperature. An AlInGaP layer 61 (FIG. 9) is grown on GaP layer 52. During annealing, the thermal expansion coefficient of AlInGaP is greater than the average expansion coefficient of GaP and Si, thus creating a compressive field to confine dislocations in AlInGaP layer 61. During cooling, the expansion coefficient of the substrate 50 becomes the average of GaP, Si, and Ge. This can be made nearly equal to the expansion coefficient of AlInGaP to achieve stress free cooling. After all thermal process is complete, one can, of course, remove the Si and Ge substrates by debonding or lapping, leaving the AlInGaP layer 61 on only the transparent GaP substrates as shown in FIG. 10.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A stress-engineered substrate, comprising:

a first stress control layer having a first lattice constant and a first thermal expansion coefficient;

a second stress control layer having a thermal expansion coefficient different from the first thermal expansion coefficient;

a joining layer disposed between the first stress control layer and the second stress control layer, the joining layer having a softening temperature selected so as to decouple the first stress control layer from the second stress control layer above the softening temperature; and an epitaxial layer having a second lattice constant and a second thermal expansion coefficient and being disposed on the first stress control layer, wherein the thermal expansion coefficient of the second stress control layer is selected so that if the second lattice constant is greater than the first lattice constant and the second thermal expansion coefficient is greater than the first thermal expansion coefficient, then a composite thermal expansion coefficient of the stress-engineered substrate is greater than or equal to the thermal expansion coefficient of the epitaxial layer below the softening temperature, and if the second lattice constant is less than the first lattice constant and the second thermal expansion coefficient is less than the first thermal expansion coefficient, then a composite thermal expansion coefficient of the stress-engineered substrate is less than or equal to the thermal expansion coefficient of the epitaxial layer below the softening temperature.

2. A stress-engineered substrate according to claim 1, wherein:

said first stress control layer is Si;

said second stress control layer is Ge; and said epitaxial layer is one of InGaAs, GaAs and InP.

3. A stress-engineered substrate according to claim 1, wherein the joining layer is made of aluminum or an aluminum alloy.

4. A stress-engineered substrate according to claim 1, further comprising:

a template layer disposed between the epitaxial layer and the first stress control layer, the template layer being a single crystal and providing a growth surface for the epitaxial layer.

5. A stress-engineered substrate according to claim 4, wherein:

said first stress control layer is Si;

said second stress control layer is Ge;

said template layer is GaP; and said epitaxial layer is AlInGaP.

* * * * *